United States Patent
Wang et al.

(10) Patent No.: US 9,567,415 B2
(45) Date of Patent: Feb. 14, 2017

(54) PIGMENT DISPERSING AGENT, PIGMENT DISPERSION SOLUTION, COLOR PHOTORESIST AND MANUFACTURE AND USE THEREOF

(71) Applicant: BOE TECHNOLOGY GROUP CO., LTD., Beijing (CN)

(72) Inventors: Xuelan Wang, Beijing (CN); Chen Tang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/355,485

(22) PCT Filed: Dec. 11, 2013

(86) PCT No.: PCT/CN2013/089132
§ 371 (c)(1),
(2) Date: Apr. 30, 2014

(87) PCT Pub. No.: WO2014/206023
PCT Pub. Date: Dec. 31, 2014

(65) Prior Publication Data
US 2015/0203608 A1 Jul. 23, 2015

(30) Foreign Application Priority Data

Jun. 27, 2013 (CN) .......................... 2013 1 0263835

(51) Int. Cl.
| | | |
|---|---|---|
| C08L 33/10 | (2006.01) |
| C08F 22/10 | (2006.01) |
| C08B 37/16 | (2006.01) |
| C08F 8/00 | (2006.01) |
| C09D 17/00 | (2006.01) |
| C09D 133/12 | (2006.01) |
| C08L 33/12 | (2006.01) |
| G03F 7/004 | (2006.01) |
| G02B 5/22 | (2006.01) |
| C09B 67/46 | (2006.01) |
| G02B 5/20 | (2006.01) |
| G03F 7/00 | (2006.01) |
| G03F 7/027 | (2006.01) |
| G03F 7/105 | (2006.01) |

(52) U.S. Cl.
CPC ........... C08F 22/10 (2013.01); C08B 37/0012 (2013.01); C08F 8/00 (2013.01); C08L 33/10 (2013.01); C08L 33/12 (2013.01); C09B 67/009 (2013.01); C09D 17/00 (2013.01); C09D 133/12 (2013.01); G02B 5/20 (2013.01); G02B 5/223 (2013.01); G03F 7/004 (2013.01); G03F 7/0007 (2013.01); G03F 7/027 (2013.01); G03F 7/105 (2013.01)

(58) Field of Classification Search
USPC .......................... 252/586; 241/22; 430/270.1
See application file for complete search history.

(56) References Cited

U.S. PATENT DOCUMENTS

| | | | | |
|---|---|---|---|---|
| 2004/0170917 A1* | 9/2004 | Takahashi | ............. | G03F 7/0233 430/270.1 |
| 2006/0052478 A1* | 3/2006 | Madsen | ................ | C08F 271/02 523/106 |
| 2014/0058017 A1 | 2/2014 | Wang et al. | | |

FOREIGN PATENT DOCUMENTS

| | | | |
|---|---|---|---|
| CN | 102286218 A | | 12/2011 |
| CN | 102816477 A | | 12/2012 |
| CN | 102898561 | * | 1/2013 |
| CN | 102898561 A | | 1/2013 |
| CN | 103357346 A | | 10/2013 |
| JP | 2006-299170 A | | 11/2006 |

OTHER PUBLICATIONS

Wang et al., Polymeric Newtworks Assembled by Adamantyl and B-Cyclodextrin Substituted polyacrylate)s: Host-Guest interactions, and the effects of Ionic Strength and Extent of Subsitution, Ind/ Eng. Chem. Res. 2010, 49, 609-612.*
Schofield et al., A Substrate-Independent Approach for Cyclodextrin Functionalized Surfaces, J. Phys. Chem. B 2006, 110, 17161-17166.*
Chinese Notice of Allowance issued Dec. 25, 2014; Appln. No. 201310263835,1.
International Search Report dated Nov. 3, 2014; PCT/CN2013/089132.
First Chinese Office Action dated Jul. 22, 2014; Appln. No. 201310263835.1
International Preliminary Report on Patentability Appln. No. PCT/CN2013/089132; Dated Dec. 29, 2015.

* cited by examiner

Primary Examiner — Monique Peets
(74) Attorney, Agent, or Firm — Ladas & Parry LLP

(57) ABSTRACT

A pigment dispersing agent, a pigment dispersion solution, a color photoresist, and a process for manufacturing the same, and use in the color film substrate and display device. The pigment dispersing agent is an amino-β-cyclodextrin modified polymethacrylate, the amino-β-cyclodextrin modified polymethacrylate being used to disperse a powdered pigment having an aromatic group, wherein the degree of modification by amino-β-cyclodextrin is 5.36%-35.40%. Because β-cyclodextrin moiety is a group having affinity for pigments, it can bind to the aromatic group in the pigment molecular structure, thereby capable of dispersing the powdered pigment having an aromatic group. The pigment dispersion solution prepared from the pigment dispersing agent has small particle size, narrow particle size distribution range, and high storage stability, thereby improving the yield of the display product.

9 Claims, No Drawings

PIGMENT DISPERSING AGENT, PIGMENT DISPERSION SOLUTION, COLOR PHOTORESIST AND MANUFACTURE AND USE THEREOF

TECHNICAL FILED

Embodiments of the invention relate to a pigment dispersing agent, a pigment dispersion solution, color photoresist, and a process for manufacturing the same, and use in color film substrates and display devices.

BACKGROUND

In the flat panel display device, the thin film transistor liquid crystal display (briefly TFT-LCD) is characterized by small volume, low energy consumption, relatively low manufacturing cost, and no irradiation, and dominates in the current flat panel display market.

Currently, the structure of TFT-LCD mainly includes aligned array substrate and color film substrate (CF), wherein, the color film substrate primarily comprises a glass substrate, a black matrix (briefly BM), a color filter and a protective film. Generally, the black matrix is arranged between the colored patterns formed from color filter in the form of grid, stripes or flecks. The primary function of the black matrix is to increase the contrast of the picture by inhibiting the blending between colors. It can also shield scattered light to prevent malfunction of TFT caused by light leakage among pixels. The primary function of the color filter is to generate three primary colors, i.e., red, green, and blue, by filtering light, and blend the three primary colors—red, green and blue in different intensity ratios, thereby exhibiting different colors and enabling the TFT-LCD to display full colors.

Currently, there are many methods for manufacturing the color filter. However, considering economic benefit, manufacturing stability, and the functional requirements of the color filter, such as color saturation, resolution, and the like, the common techniques include staining methods, pigment dispersion methods, printing methods, as well as electrodeposition methods. Among these, the pigment dispersion method becomes the primary method for preparing the color filter due to the advantages such as high color purity, high precision, high resolution possessed by the thus-prepared color filter.

The basic principle for the pigment dispersion method is to coat a color photoresist on a transparent underlying substrate, then irradiate the coating with ultraviolet light or similar light to form a cured color filter. The color photoresist comprises a pigment dispersion solution which primarily comprises a colored pigment, a dispersing agent, a resin and a solvent. The colored pigment in the pigment dispersion solution can decide the color of the color filter finally formed.

The stability of the pigment dispersion solution is very important. However, the pigment dispersion solution known by persons skilled in the art often has the problem of poor stability. The pigment particles in the pigment dispersion solution are prone to deposition, or even agglomeration. This will directly result in the color film substrate having an uneven surface of the color filter layer, an uneven coating of the color filter layer, thereby causing adverse effect such as light leakage of the color film substrate to occur. Embodiments of the invention aim to provide a pigment dispersing agent that can improve the stability of the pigment dispersion solution, and a process for manufacturing the same.

SUMMARY

An embodiment of the invention provides a pigment dispersing agent, which is a polymethacrylate modified with an amino-$\beta$-cyclodextrin useful for the dispersion of a pigment powder having an aromatic group, wherein the degree of modification by the amino-$\beta$-cyclodextrin is 5.36%-35.40%.

For example, the amino-$\beta$-cyclodextrin is 6-deoxy-6-ethylenediamino-$\beta$-cyclodextrin.

The degree of modification by the amino-$\beta$-cyclodextrin is 11.76%-25.17%.

An embodiment of the invention provides a process for manufacturing the aforesaid pigment dispersing agent comprising:

1 part by weight of polymethacrylate and 10-50 parts by weight of amino-$\beta$-cyclodextrin are dissolved in N,N-dimethylformamide in an ice bath, to which 0.1-5 parts by weight of sodium alkoxide is added as the catalyst. The mixture is heated to 60-220° C., and reacted with agitation for 5-20 hours, to yield the crude dispersing agent. The crude dispersing agent is extracted with hydrochloric acid, to give the pigment dispersing agent.

An embodiment of the invention provides a pigment dispersion solution, comprising any one of the pigment dispersing agents as prepared above, which is present the pigment dispersion solution in an amount of 1.5%-16.32% by weight.

The pigment dispersion solution further comprises:
2.12%-6.06% by weight of a binder resin;
9.72%-23.31% by weight of a powdered pigment having an aromatic group;
44.11%-77.36% by weight of an alkaline or neutral organic solvent; and
5.63-10.2% by weight of an alcohol solvent.

For example, the binder resin comprises one or more of a polyester acrylate oligopolymer, a modified styrene acrylic copolymer, and an anti-yellowing aldehyde resin. The alkaline or neutral organic solvent comprises one or more of propylene glycol mono-methyl ether acetate, propylene glycol mono-methyl ether, cyclohexane, propylene glycol diacetate, 2-heptanone, and cyclopentanone. The alcohol solvent can be n-butanol. The powdered pigment having an aromatic group comprises a mixture of blue and violet pigments. The blue pigment comprises one or more of phthalocyanine pigments, azo pigments, and heterocycle pigments. The violet pigment comprises one or more of thioindigo pigments and dioxazine pigments.

An embodiment of the invention provides a process for manufacturing the above pigment dispersion solution, comprising:

mixing 1.5%-16.32% by weight of the aforesaid pigment dispersing agent, 2.12%-6.06% by weight of a binder resin, and 44.11%-77.36% by weight of an alkaline or neutral organic solvent and agitating for 30-60 minutes, to provide a primary mixture;

adding 9.72%-23.31% by weight of the powdered pigment having an aromatic group and grinding beads having the same weight as the powdered pigment having an aromatic group to the primary mixture and agitating for 50-120 minutes, to provide a secondary mixture;

adding 5.63%-10.2% by weight of an alcohol solvent to the secondary mixture and agitating for 10-30 minutes, to provide a mixture;

filtering the mixture to remove the grinding beads, to provide a pigment premix; and transferring the pigment premix into a sand grinder for dispersion by grinding, to provide the pigment dispersion solution.

For example, the transferring pigment premix into a sand grinder for dispersion by grinding comprises:

grinding the pigment premix at a low speed for 5-10 minutes, with the linear speed of the sand grinder being set at 2.5-5.5 m/sec, to provide a pigment secondary mixture; and grinding the pigment secondary mixture at a high speed grinding for 2-6 hours, with the linear speed of the sand grinder being set at 7.5-12.5 m/sec.

An embodiment of the invention provides a color photoresist comprising any one of the pigment dispersion solutions as prepared above, wherein the pigment dispersion solution is present in the color photoresist in an amount of 30.22%-70.3% by weight.

The color photoresist further comprises:
10.5%-20.18% by weight of an alkaline soluble resin;
2.1%-7.3% by weight of an unsaturated resin monomer;
1.0%-5.3% by weight of a photoinitiator;
6.85%-55.67% by weight of an organic solvent; and
0.51%-1.49% by weight of an additive.

For example, the alkaline soluble resin comprises one or more of polymethacrylate and amine modified epoxyacrylate. The unsaturated resin monomer comprises one or more of epoxyacrylate, ethoxy-containing acrylate, aliphatic polyurethane acrylate and aliphatic polyisocryanate. The photoinitiator comprises one or more of ketone oxime ester photoinitiators, benzil photoinitiators and alkylphenone photoinitiators. The organic solvent comprises one or more of propylene glycol mono-methyl ether acetate, propylene glycol mono-methyl ether, cyclohexane, propylene glycol diacetate, 2-heptanone and cyclopentanone. The additive comprises one or more of a leveling agent, a coupling agent, anti-foaming agent, and an ultraviolet absorbent.

An embodiment of the invention provides a process for manufacturing the above color photoresist, comprising:

mixing and agitating 1.0%-5.3% by weight of a photoinitiator, 6.85%-55.67% by weight of an organic solvent, and 0.51%-1.49% by weight of an additive until the photoinitiator is dissolved, to provide a first mixture;

adding 10.5%-20.18% by weight of an alkaline soluble resin and 2.1%-7.3% by weight of an unsaturated resin monomer to the first mixture, and agitating to transparency, to provide a second mixture; and adding 30.22%-70.3% by weight of the aforesaid pigment dispersion solution to the second mixture and agitating for 8-24 hours, to provide the color photoresist.

An embodiment of the invention provides a color film substrate comprising a color filter, wherein the color filter is prepared from the aforesaid color photoresist.

The invention further provides a display device comprising the aforesaid color film substrate.

DETAILED DESCRIPTION

In order to solve the technical problems that the pigment dispersion solution is not stable, the embodiment of the invention provides a pigment dispersing agent, a pigment dispersion solution, a color photoresist, and a process for manufacturing the same, and a color film substrate and a display device. In the technical solution, the pigment dispersing agent, amino-β-cyclodextrin modified polymethacrylate, is used to disperse the powdered pigment having an aromatic group, wherein the degree of modification by amino-β-cyclodextrin is 5.36%-35.40%. The β-cyclodextrin moiety is a group having affinity for pigments, and it can bind to the aromatic group in the pigment molecular structure, thus capable of dispersing the powdered pigment having an aromatic group. The pigment dispersion solution prepared from the aforesaid pigment dispersing agent has small particle size, narrow range of particle size distribution, and high storage stability. Therefore, the color photoresist prepared from the pigment dispersion solution has good development performance and high color saturation, thereby improving the production yield. In order to make the purpose, technical solutions and advantages of the present invention clearer, the following examples are provides to further illustrate the invention in details.

The embodiment of the invention provides a pigment dispersing agent which is an amino-β-cyclodextrin modified polymethacrylate useful for dispersing the powdered pigment having an aromatic group, wherein the degree of modification by amino-β-cyclodextrin is 5.36%-35.40%.

In the embodiment of the invention, the polymethacrylates have a number average molecular weight of 8,000-20,000. The cyclodextrin is formed by an end-to-end linkage of D-glucopyranose unit via α-1,4-glycoside bonds. It can have cavities with different size depending on the difference in the number of the glucose units, wherein the most common ones are α-, β- and γ-cyclodextrin having 6, 7, and 8 glucose units, respectively. Because cyclodextrin has a hydrophobic cavity and a hydrophilic wall, it can bind to various guest molecules to form supermolecular inclusion complexes wish such special structure. Among them, β-cyclodextrin is easy to prepare and cheap. Moreover, β-cyclodextrin has a cavity size that matches the aromatic group. Therefore, it can be used to disperse the powdered pigment having an aromatic group. The embodiments of the present invention make use of this advantage of β-cyclodextrin to modify polymethacrylate with amino-β-cyclodextrin at degree of modification of 5.36%-35.40%. The amino-β-cyclodextrin modified polymethacrylate thus formed can conveniently disperse the powdered pigment having an aromatic group, wherein the hydrophobic cavity of β-cyclodextrin moiety can bind to the hydrophobic aromatic group in the pigment molecular structure. Moreover, the hydrophilicity of amino further increases the hydrophilicity of the external wall of β-cyclodextrin. Therefore, the powdered pigment can be well dispersed in a polar solvent. Moreover, because β-cyclodextrin has a low price, it facilitates the reduction of the cost of the pigment dispersing agent and then the cost of the pigment dispersion solution as well as the color photoresist that uses the pigment dispersing agent.

The degree of modification by amino-β-cyclodextrin in the amino-β-cyclodextrin modified polymethacrylate is, for example, 5.36%-35.40%. Where the degree of modification by amino-β-cyclodextrin is less than 5.36%, the number of amino-β-cyclodextrins in a single polymethacrylate chain is small, which will restrict the binding thereof on the pigment particles and thus be insufficient to disperse the pigment particles. Where the degree of modification by amino-β-cyclodextrin is higher than 35.40%, the number of amino-β-cyclodextrins in a single polymethacrylate chain is large, resulting in a large single molecule which will be not well dissolved in the solvent, and be prone to crystalization and precipitation under low temperature, affecting the stability of the pigment dispersion solution.

Further, where the degree of modification by amino-β-cyclodextrin is 11.76%-25.17%, the pigment dispersion effect can be optimal.

For example, the amino-β-cyclodextrin is 6-deoxy-6-ethylenediamino-β-cyclodextrin.

The embodiment of the invention further provides a process for manufacturing a pigment dispersing agent comprising:

1 part by weight of polymethacrylate and 10-50 parts by weight of amino-β-cyclodextrin are dissolved in N,N-dimethylformamide under an ice bath condition, to which 0.1-5 parts by weight of sodium alkoxide is added as the catalyst. The mixture is heated to 60-220° C., and is reacted with agitation for 5-20 hours, to yield crude dispersing agent. The crude dispersing agent is extracted with hydrochloric acid, to give the pigment dispersing agent.

In the embodiments of the invention, in addition to the solvent N,N-dimethylformamide (DMF), other solvents capable of dissolving polymethacrylate and 6-deoxy-6-ethylenediamino-β-cyclodextrin can also be used, but DMF is preferred. The sodium alkoxide selected as the catalyst, can be sodium methoxide, sodium ethoxide, and the like. The hydrochloric acid can, for example, be 5% hydrochloric acid. After extraction, the extractives can be washed with 5% sodium bicarbonate, deionized water, and saturated saline, followed by vacuum drying to give the pigment dispersing agent, that is, the amino-β-cyclodextrin modified polymethacrylate.

The embodiment of the invention provides a pigment dispersion solution comprising the aforesaid pigment dispersing agent, wherein the pigment dispersing agent is present in the pigment dispersion in an amount of 1.5%-16.32% by weight.

Because the β-cyclodextrin moiety in the pigment dispersing agent can bind to the aromatic group, and the amino also increases the hydrophilicity of the external wall of the β-cyclodextrin, the pigment can be well dispersed in the pigment dispersion solution, ensuring that the pigment dispersion solution maintains good stability. For example, where the pigment dispersing agent is present in the pigment dispersion solution in an amount of 1.5%-16.32%, the pigment dispersion solution thus provided has a good stability.

The pigment dispersion solution further comprises:
2.12%-6.06% by weight of a binder resin;
9.72%-23.31% by weight of a powdered pigment having an aromatic group;
44.11%-77.36% by weight of an alkaline or neutral organic solvent; and
5.63-10.2% by weight of an alcohol solvent.

For example, the binder resin comprises one or more of a polyester acrylate oligopolymer, a modified styrene acrylic copolymer, and an anti-yellowing aldehyde resin. The organic solvent comprises alkaline solvents such as ketones, esters, or some aromatic solvent, or neutral solvents, such as aliphatic solvents, or some aromatic solvents, preferably one or more of propylene glycol mono-methyl ether acetate, propylene glycol mono-methyl ether, cyclohexane, propylene glycol diacetate, 2-heptanone and cyclopentanone. The alcohol solvent comprises n-butanol. The powdered pigment having an aromatic group comprises mixtures of blue and violet pigments, wherein the blue pigment comprises one or more of phthalocyanine pigments, azo pigments, and heterocyclyl pigments, and the violet pigment comprises one or more of thioindigo pigments and dioxazine pigments. The aforesaid components are all commonly used and known in the art for the preparation of a pigment dispersion solution. A person skilled in the cart can easily select the appropriate components upon reading the present instruction.

The embodiment of the invention further provides a process for manufacturing a pigment dispersion solution comprising:

mixing 1.5%-16.32% by weight of the pigment dispersing agent, 2.12%-6.06% by weight of a binder resin, and 44.11%-77.36% by weight of an alkaline or neutral organic solvent and agitating for 30-60 minutes, to provide a primary mixture;

adding 9.72%-23.31% by weight of a powdered pigment having an aromatic group and grinding beads having the same weight as the powdered pigment having an aromatic group to the primary mixture and agitating for 50-120 minutes, to provide a secondary mixture;

adding 5.63%-10.2% by weight of an alcohol solvent to the secondary mixture, and agitating for 10-30 minutes, to provide a mixture;

filtering the mixture to remove the grinding beads, to provide pigment premix; and transferring the pigment premix into a sand grinder for dispersion by grinding, to provide the pigment dispersion solution.

For example, the transferring pigment premix into a sand grinder for dispersion by grinding comprises:

grinding the pigment premix at a low speed for 5-10 minutes, with the linear speed of the sand grinder being set at 2.5-5.5 m/sec, to provide pigment secondary mixture;

grinding the pigment secondary mixture at a high speed grinding for 2-6 hours, with the linear speed of the sand grinder being set at 7.5-12.5 m/sec.

The embodiment of the invention further provides a color photoresist comprising the pigment dispersion solution, wherein the pigment dispersion solution is present in the color photoresist in an amount of 30.22%-70.3% by weight.

The color photoresist further comprises:
10.5%-20.18% by weight of an alkaline soluble resin;
2.1%-7.3% by weight of an unsaturated resin monomer;
1.0%-5.3% by weight of a photoinitiator;
6.85%-55.67% by weight of an organic solvent; and
0.51%-1.49% by weight of an additive.

For example, the alkaline soluble resin comprises one or more of polymethacrylate and amine modified epoxyacrylate. The unsaturated resin monomer comprises one or more of epoxyacrylate, ethoxy-containing acrylate, aliphatic polyurethane acrylate, and aliphatic polyisocryanate, such as dipentaerythritol penta/hexaacrylate (DPHA), trimethylolpropane triacrylate (TMPTA), pentaerythritol tetraacrylate (PETA), dipentaerythritol pentaacrylate (DPPA). The photoinitiator comprises one or more of ketone oxime ester photoinitiator, benzil photoinitiator (such as, diacetophenone, α,α-diethoxyacetophenone) and alkylphenone photoinitiator (such as, α-amine alkylphenone). The organic solvent comprises alkaline solvents, such as ketones, esters, ethers, and aromatic solvents or neutral solvents such as aliphatic solvents, in particular, 2-heptanone, cyclopentanone, propylene glycol diacetate, propylene glycol monomethyl ether acetate, propylene glycol mono-methyl ether, xylene, cyclohexane and the like. The additive comprises one or more of leveling agents, coupling agents, anti-foaming agents, and ultraviolet absorbents. The leveling agent is for example EFKA-3883. The coupling agent is for example γ-(2,3-epoxypropyloxy)propyltrimethoxysilane (KH-560) and/or γ-methacryloxy propyltrimethylsilane (KH-570). The anti-foaming agent is for example BYK-055. The ultraviolet absorbent is for example UV-0 (2,4-dihydroxylBenzophenone). The aforesaid components are all commonly used and known in the art for the preparation of a color photoresist. A person skilled in the art can easily select the appropriate component and determine its content upon reading the present description.

The embodiment of the invention further provides a process for manufacturing a color photoresist comprising:

mixing and agitating 1.0%-5.3% by weight of a photoinitiator, 6.85%-55.67% by weight of an organic solvent, and 0.51%-1.49% by weight of an additive until the photoinitiator is dissolved, to provide a first mixture;

adding 10.5%-20.18% by weight of an alkaline soluble resin and 2.1%-7.3% by weight of unsaturated resin monomer to the first mixture and agitating to transparency, to provide a second mixture; and adding 30.22%-70.3% by weight of the pigment dispersion solution to the second mixture and agitating for 8-24 hours, to provide the color photoresist.

The embodiment of the invention further provides a color film substrate comprising a color filter, wherein the color filter is prepared from the aforesaid color photoresist.

In the embodiments of the invention, the color filter is prepared using the conventional manufacturing process, except that the color photoresist used is the color photoresist of the embodiments of the invention. Because the color photoresist has good pigment dispersion and is stable, the resulting color filter has a smooth surface and evenly coating, thereby improving the quality of the color film substrate.

The embodiment of the invention further provides a display device comprising the color film substrate in the aforesaid embodiment. Except for the color filter in the color film substrate, other structures of the display device are the same as those known by persons skilled in the art. The display device may be any product or component having display function, such as liquid crystal panel, e-paper, OLED panel, liquid crystal TV, liquid crystal display, digital frame, cell phone, tablet PC, and the like.

Specific examples are provided below to further explain the pigment dispersing agent, the pigment dispersion solution, and the color photoresist of the invention, and the process for manufacturing the same, respectively. However, the present invention is not limited to the following examples. In order to avoid repetitive illustrations, the following examples are made using the 6-deoxy-6-ethylenediamino-β-cyclodextrin modified polymethacrylate as an example. However, other amino-β-cyclodextrin modified polymethacrylates are also within the scope of the invention.

Example

I. A Process for Manufacturing the Pigment Dispersing Agent

The part in the following examples means part by weight.

1. Preparation of 6-deoxy-6-ethylenediamino-β-cyclodextrin 50 parts of water are added to a reactor, to which 13 parts of β-cyclodextrin are added in batches with stirring. The solution is maintained at a temperature between 10-20° C. in a water bath. An aqueous sodium hydroxide solution (1 part of sodium hydroxide is dissolved in 4 parts of water) is added dropwise to the solution. After the cyclodextrin is completely dissolved, agitation is continued for 1 hour. A solution of p-benzenesulfonyl chloride in acetonitrile (2 parts of p-benzenesulfonyl chloride dissolved in 6 parts of acetonitrile) is slowly added dropwise to the aforesaid solution. The mixture is agitated at constant temperature for 2-2.5 hours, followed by filtration to remove the insoluble. The solution is adjusted by 10% hydrochloric acid to about 8-9 of a pH value. The solution is allowed to stand at about 2° C. overnight to allow a large amount of white precipitates to separate out. The precipitates are collected by filtration, followed by re-crystalization with water (3X). After vacuum drying at 50° C. for 12 hours, a loose white solid, i.e., mono-(6-p-toluenesulfonyl)-β-cyclodextrin, is given. 2 parts of mono-(6-p-toluenesulfonyl)-β-cyclodextrin and 1 part of ethylenediamine are charged to a 100 mL round-bottom flask, and then 20 parts of N,N-dimethylformamide (DMF) are added. The mixture is refluxed at 80° C. for 4 hours. After the reaction is completed and cooled off, the DMF solvent is removed by vacuum evaporation. The resulting crude is added dropwise to 30 parts of acetone and washed 3 times using the same method to give a white solid, which is vacuum dried to provide 6-deoxy-6-ethylenediamino-β-cyclodextrin. Results of NMR detection confirm that the resulting product is 6-deoxy-6-ethylenediamino-β-cyclodextrin (spectral peaks and chemical shift of the hydrogen spectrum of 6-deoxy-6-ethylenediamino-β-cyclodextrin are as follows: $^1$H NMR (300 MHz, D$_2$O, ppm) δ: 2.78-2.81 (m, 4H), 3.03-3.07 (dd, 1H), 3.34-3.38 (m, 1H), 3.44-3.55 (m, 26H), 3.73-3.87 (m, 14H), 3.99-4.04 (m, 1H), 4.95 (s, 7H)).

2. Preparation of the Polymethacrylate 1 part of methyl methacrylate, 1.2 parts of butyl methacrylate, 2.1 parts of isobornyl methacrylate, 0.05-0.15 parts of dodecyl mercaptan and 150 mL solvent propylene glycol mono-methyl ether acetate are pre-mixed. The mixture is heated to 80° C. in a 85° C. oil bath, to which 0.03 part of a hot initiator azodiisobutyronitrile is slowly added dropwise in half an hour. The reaction is kept at a temperature of 80° C., and agitated for 5-6 h. After the completion of the reaction, petroleum ether is added for deposition, followed by vacuum drying to give the product. The polymethacrylate is tested by a gel filtration chromatograph to have a molecular weight of 8,000-20,000.

3. Preparation of the Pigment Dispersing Agent

The preparation of 6-deoxy-6-ethylenediamino-β-cyclodextrin modified polymethacrylate is provided as an example. The processes for manufacturing other amino-β-cyclodextrin modified polymethacrylates are similar except for slight variations on the reaction time, heating temperature, and the level of the catalyst. Each of the components of the pigment dispersing agent and parts by weight thereof used in Examples 1-6 are shown in Table 1, and the reaction is described below. 1 part of polymethacrylate and 10-50 parts of 6-deoxy-6-ethylenediamino-β-cyclodextrin are dissolved in N,N-dimethylformamide in an ice bath, and 0.10-0.25 parts of sodium alkoxide is added as the catalyst. The mixture is heated to 60-120° C., and agitated for 5-10 h before the reaction is stopped. The reaction is extracted with 5% hydrochloric acid solution. The extract is washed with 5% sodium bicarbonate, deionized water and saturated saline, respectively, and vacuum dried to give 6-deoxy-6-ethylenediamino-β-cyclodextrin modified polymethacrylate. The degree of modification by 6-deoxy-6-ethylenediamino-β-cyclodextrin is determined by a resin acid value assay, showing degree of modification by 6-deoxy-6-ethylenediamino-β-cyclodextrin of 5.36%-35.40%.

TABLE 1 components of the pigment dispersing agents in Examples 1-6 and parts by weight thereof

| Components (parts by weight) | Ex. 1 | Ex. 2 | Ex. 3 | Ex. 4 | Ex. 5 | Ex. 6 |
|---|---|---|---|---|---|---|
| polymethacrylate | 1 | 1 | 1 | 1 | 1 | 1 |
| 6-deoxy-6-ethylenediamino-β-cyclodextrin | 10 | 20 | 25 | 30 | 30 | 50 |
| N,N-dimethylformamide | 50 ml | 70 ml | 90 ml | 100 ml | 110 ml | 150 ml |
| sodium alkoxide | 0.10 | 0.15 | 0.18 | 0.20 | 0.22 | 0.25 |
| Acid value of 6-deoxy-6-ethylenediamino-β-cyclodextrin modified polymethacrylate | 106 mg KOH/g | 75 mg KOH/g | 90 mg KOH/g | 100 mg KOH/g | 110 mg KOH/g | 104 mg KOH/g |
| degree of modification by 6-deoxy-6-ethylenediamino-β-cyclodextrin modified polymethacrylate | 5.36% | 11.76% | 15.09% | 18.03% | 25.17% | 35.40% |

II. A Process for Manufacturing the Pigment Dispersion Solution

In Examples 7-10, the components of the pigment dispersion solution and parts by weight thereof as shown in Table 2 are employed for the following reactions. 1.5%-16.31% by weight of the pigment dispersing agent from the aforesaid Example 2-5, 2.12%-6.06% by weight of a binder resin, and 44.11%-67.64% by weight of an alkaline or neutral solvent are mixed, mechanically agitated for 30-60 minutes (min) at an agitation speed of 1,000-3,000 rotations/minute (rpm), to provide a primary mixture, wherein the binder resin is one or more of a polyester acrylate oligopolymer (model CN2284), a modified styrene acrylic copolymer (such as styrene-acrylic resin Joncryl 611) and an anti-yellowing aldehyde resin (such as BASF A81 from BASF). 9.72%-23.31% by weight of the powdered pigment having an aromatic group and grinding bead with particle size of 1 mm having the same weight as the powdered pigment are added to the primary mixture, mechanically agitated for 50-120 min at an agitation speed of 2,000-4,500 rpm, to provide a secondary mixture. 5.63%-10.2% by weight of an alcohol solvent is added to a secondary mixture followed by a mechanical agitation for 10-30 min at an agitation speed of 500-1,000 rpm, to provide a mixture. The mixture is filtered to remove the grinding beads, to provide a pigment premix. The pigment premix is transferred into a sand grinder for dispersion by grinding, where it is subjected to a low speed grinding for 5-10 min, with a linear speed of the grinder of 2.5-5.5 m/sec (m/s), followed by a high speed grinding for 2-6 hours with a linear speed of the grinder of 7.5-12.5 m/s, to provide the pigment dispersion solution. The pigment dispersion solutions prepared in Examples 7-10 are evaluated for the particle size, viscosity and storage stability. After testing with a nanometer particle size detector, it is found that the pigment dispersion solution prepared in Example 7 has a particle size of 31.97 nanometer (nm), a particle size distribution range of 10 nm-100 nm, and the maximal volumetric fraction of 15% which corresponds to a particle size of about 30 nm. The pigment dispersion solution known by persons skilled in the art, however, has a large particle size of 60-200 nm and a wide particle size distribution range of 10-200 nm. By comparison, it can be see that the pigment dispersion solution prepared in Example 7 has a small particle size, a narrow particle size distribution range and a homogenous distribution. Moreover, after 3 months of viscosity and particle size testing, it is found that it has good storage stability. The pigment dispersion solutions provided in Examples 8-10 are similar to that of Example 7, and their particle size, viscosity and storage stability are also shown in Table 2.

TABLE 2 components of the pigment dispersion solutions in Example 7-10 and percent by weight thereof

| Components (wt %) | | Ex. 7 | Ex. 8 | Ex. 9 | Ex. 10 |
|---|---|---|---|---|---|
| powdered pigment | phthalocyanine blue PB 15:6 | 8.2 | 12.6 | 17.4 | 19.7 |
| | pigment violet V23 | 1.52 | 2.31 | 3.18 | 3.61 |
| pigment dispersing agent | degree of modification: 11.76% | 1.5 | 0 | 0 | 0 |
| | degree of modification: 15.09% | 0 | 4.8 | 0 | 0 |
| | degree of modification: 18.03% | 0 | 0 | 10.29 | 0 |
| | degree of modification: 25.17% | 0 | 0 | 0 | 16.32 |
| binder resin | Joncryl 611 | 1 | 2.5 | 3.25 | 4.48 |
| | BASF A81 | 0 | 0 | 1.01 | 1.58 |
| | CN 2284 | 1.12 | 0.86 | 0 | 0 |
| alkaline or neutral organic solvent | PMA (propylene glycol mono-methyl ether acetate) | 77.36 | 69.93 | 59.24 | 44.11 |
| alcohol solvent | n-BuOH (n-butanol) | 9.3 | 7.0 | 5.63 | 10.2 |
| result evaluation | particle size (nm) | 31.97 | 35.4 | 34.87 | 39.42 |
| | viscosity (cps) | 4.55 | 4.98 | 5.04 | 5.37 |
| | storage stability | Good | Good | Good | Good |

III. Preparation of the Color Photoresist

In Examples 11-14, each of the components of the color photoresist and parts by weight thereof as shown in Table 3 are used for the following reaction. 1.0%-5.3% by weight of a photoinitiator, 6.85%-55.67% by weight of an organic solvent and 0.51%-1.49% by weight of an additive are mixed together, thoroughly agitated until the photoinitiator is dissolved, to provide a first mixture. Here, the photoinitiator is selected from ketone oxime ester photoinitiator (such as OXE01) and isopropyl thioxanthone (ITX). 10.5%-20.18% by weight of an alkaline soluble resin and 2.1%-7.3% by weight of an unsaturated resin monomer are added to the first mixture, and agitated to transparency, to provide a second mixture. Here, the alkaline soluble resin is SB400 aromatic acid-methacrylate, and the unsaturated resin monomer is selected from EB270 aliphatic polyurethane diacrylate and SR399LV penta/hexaacrylate. 30.22%-70.3% by weight of the pigment dispersion solution prepared in Examples 7-10 is added to the second mixture, and agitated for 8-24 hours, to form the color photoresist. The color photoresists provided in Examples 11-14 are evaluated for development state, pixel edge and film layer surface. The evaluation method involves coating the color photoresist on the surface of the glass substrate. After pre-baking treatment, the photoresist film layer is exposed to ultraviolet light at an luminance of 80-300 Mj/cm$^2$. The exposed film layer is placed into an alkaline development solution for development, followed by baking at 200-230° C. for 20-30 minutes, to produce the desired pattern. It is observed that the color photoresists provided in Examples 11-14 are removed in the form of powder, have pixels with smooth edge and no residues, and achieve a film layer having smooth surface. On the contrary, it is observed from the microscope that the color photoresist using the conventional pigment dispersing agent presents is removed in the form of mass, and the pixel edge is prone to serration and is not smooth, and the film layer surface is prone to unevenness.

from the pigment dispersion solution has good development performance and high color saturation, and greatly improves the product yield and quality of TFT-LCD.

It is apparent that a person skilled in the art can make various modifications and variations on the invention without departing from the spirits and scope of the invention. Therefore, if such modification and variations of the invention fall within the scope of the appended claims and equivalents thereof, the invention intends to comprise these modifications and variations.

This application claims the priority of Chinese application No. 201310263835.1 filed on Jun. 27, 2013, which is incorporated herein by reference in its entirety as part of the present application.

The invention claimed is:

1. A pigment dispersing agent, wherein the pigment dispersing agent is amino-β-cyclodextrin modified polymethacrylate useful for dispersing a powdered pigment having an aromatic group, wherein the degree of modification by amino-β-cyclodextrin is 11.76%-25.17%, wherein the amino-β-cyclodextrin is 6-deoxy-6-ethylenediamino-β-cyclodextrin, wherein polymethacrylate has a number average molecular weight of 8,000-20,000, and

TABLE 3 each of the components of the color photoresists in Examples 11-14 and percent by weight thereof

| | Components (wt %) | Ex. 11 | Ex. 12 | Ex. 13 | Ex. 14 |
|---|---|---|---|---|---|
| pigment dispersion solution | Example 7 | 30.22 | 0 | 0 | 0 |
| | Example 8 | 0 | 48.47 | 0 | 0 |
| | Example 9 | 0 | 0 | 61.35 | 0 |
| | Example 10 | 0 | 0 | 0 | 70.3 |
| alkaline soluble resin | SB400 | 10.5 | 20.18 | 16..61 | 13.54 |
| unsaturated resin monomer | SR399LV | 1.45 | 6.23 | 5.14 | 2.16 |
| | EB270 | 0.65 | 1.07 | 0.63 | 0.36 |
| photoinitiator | OXE01 | 0.64 | 1.55 | 3.61 | 4.55 |
| | ITX | 0.36 | 0.25 | 0.37 | 0.75 |
| organic solvent | PMA | 55.67 | 21.48 | 11.36 | 6.85 |
| additive | leveling agent (EFKA-3883), coupling agent (KH-560/KH570), anti-foaming agent (BYK-055), ultraviolet absorbent UV-O (2,4-dihydroxyldiphenone) | 0.51 | 0.77 | 0.93 | 1.49 |
| result evaluation | development state | color photoresist removed in the form of powder | color photoresist removed in the form of powder | color photoresist removed in the form of powder | color photoresist removed in the form of powder |
| | pixel edge | even, no residue | even, no residue | even, no residue | even, no residue |
| | film layer surface | smooth | smooth | smooth | smooth |

As can be seen from the aforesaid specific examples, the pigment dispersion solution prepared from the pigment dispersing agents of the embodiments of the invention (wherein the degree of modification by amino-β-cyclodextrin is 5.36%-35.40%) has a small particle size, a narrow particle size distribution range, and high storage stability. This is because β-cyclodextrin moiety can bind to the aromatic group in the pigment molecular structure, thereby capable of thoroughly dispersing the powdered pigment having an aromatic group. The color photoresist prepared wherein polymethacrylate is prepared from monomers comprising methyl methacrylate, butyl methacrylate, and isobornyl methacrylate.

2. A pigment dispersion solution comprising the pigment dispersing agent claim 1, wherein the pigment dispersing agent is present in the pigment dispersion solution in an amount of 1.5%-16.32% by weight.

3. The pigment dispersion solution according to claim 2, further comprising:

2.12%-6.06% by weight of a binder resin;

9.72%-23.31% by weight of the powdered pigment having an aromatic group;
44.11%-77.36% by weight of an alkaline or neutral organic solvent; and
5.63-10.2% by weight of an alcohol solvent.

4. The pigment dispersion solution according to claim 3, wherein the binder resin comprises one or more of a polyester acrylate oligopolymer, a modified styrene acrylic copolymer, and an anti-yellowing aldehyde resin; the alkaline or neutral organic solvent comprises one or more of propylene glycol mono-methyl ether acetate, propylene glycol mono-methyl ether, cyclohexane, propylene glycol diacetate, 2-heptanone, and cyclopentanone; the alcohol solvent is n-butanol; the powdered pigment having an aromatic group comprises a mixture of blue and violet pigments; the blue pigment comprises one or more of phthalocyanine pigments, azo pigments, and heterocycle pigments; and the violet pigment comprises one or more of thioindigo pigments and dioxazine pigments.

5. A color photoresist comprising the pigment dispersion solution according to claim 2, wherein the pigment dispersion solution is present in the color photoresist in an amount of 30.22%-70.3% by weight.

6. The color photoresist according to claim 5, further comprising:

5.5%-20.18% by weight of an alkaline soluble resin;
2.1%-7.3% by weight of an unsaturated resin monomer;
1.0%-5.3% by weight of a photoinitiator;
3.85%-55.67% by weight of an organic solvent; and
0.51%-1.49% by weight of an additive.

7. The color photoresist according to claim 6, wherein the alkaline soluble resin comprises one or more of polymethacrylate and amine modified epoxyacrylate; the unsaturated resin monomer comprises one or more of epoxyacrylate, ethoxy-containing acrylate, aliphatic polyurethane acrylate and aliphatic polyisocryanate; the photoinitiator comprises one or more of ketone oxime ester photoinitiators, benzil photoinitiators and alkylphenone photoinitiators, the organic solvent comprises one or more of propylene glycol monomethyl ether acetate, propylene glycol mono-methyl ether, cyclohexane, propylene glycol diacetate, 2-heptanone and cyclopentanone; and the additive comprises one or more of a leveling agent, a coupling agent, an anti-foaming agent, and an ultraviolet absorbent.

8. A color film substrate comprising a color filter, wherein the color filter is prepared from the color photoresist according to claim 5.

9. A display device comprising the color film substrate according to claim 8.

* * * * *